United States Patent
Schlosser et al.

(10) Patent No.: US 9,264,830 B2
(45) Date of Patent: *Feb. 16, 2016

(54) AUDIO LEVEL METER

(75) Inventors: Markus Schlosser, Hannover (DE); Ulrich Schreiber, Hohenhameln/Equord (DE); Mario Sieck, Isemhagen (DE)

(73) Assignee: Thomson Licensing (FR)

(*) Notice: Subject to any disclaimer, the term of this patent is extended or adjusted under 35 U.S.C. 154(b) by 632 days.

This patent is subject to a terminal disclaimer.

(21) Appl. No.: 13/608,018

(22) Filed: Sep. 10, 2012

(65) Prior Publication Data

US 2013/0058491 A1 Mar. 7, 2013

Related U.S. Application Data

(62) Division of application No. 12/309,791, filed as application No. PCT/EP2007/058206 on Aug. 7, 2007, now Pat. No. 8,295,958.

(30) Foreign Application Priority Data

Aug. 8, 2006 (EP) .................................. 06300863

(51) Int. Cl.
 *H04R 29/00* (2006.01)
 *H04S 7/00* (2006.01)
 (Continued)

(52) U.S. Cl.
 CPC ............... *H04R 29/008* (2013.01); *H04R 29/00* (2013.01); *G01R 19/02* (2013.01); *G01R 19/04* (2013.01); *H04S 7/40* (2013.01)

(58) Field of Classification Search
 CPC ........ H04R 29/008; H04S 7/40; G01R 13/00; G01R 13/0236; G01R 19/003; G01R 19/02; G01R 19/04; G01D 7/00; G01H 3/14

USPC ...... 381/56, 58; 324/76.12, 99 D, 103 P, 119; 327/344, 350, 354, 362; 702/61, 64, 702/85, 103, 189–199

See application file for complete search history.

(56) References Cited

U.S. PATENT DOCUMENTS 3,949,294 A 4/1976 Imura
3,999,125 A 12/1976 Takeda et al.
(Continued)

FOREIGN PATENT DOCUMENTS

CA 1271859 7/1990
DK 181987 4/1987
(Continued)

OTHER PUBLICATIONS

F. Floru: "Attack and Release Time Constants in RMS-Based Feedback Compressors", Oct. 1999, Journal of the Audio Engineerng Society, pp. 788-804, XP000928474.
(Continued)

*Primary Examiner* — Jesse Elbin
(74) *Attorney, Agent, or Firm* — Jack Schwartz & Associates, PLLC

(57) ABSTRACT

A circuit for correcting the output of an audio level meter comprises input means for generating the square or the absolute value of an input signal, a low pass filter having a predetermined attack time and release time, and output means for converting the output signal from a linear scale to a logarithmic scale. The circuit further comprises a correction means to which an information about whether the input signal to the audio level meter was subject to squaring or converting into an absolute value at the input, as well as the attack and release time of the low pass filter, are supplied as input values, and which provides, at its output, a value representing the difference between the output of the audio level meter and the true signal power of the input signal.

10 Claims, 4 Drawing Sheets

(51) Int. Cl.
*G01R 19/02* (2006.01)
*G01R 19/04* (2006.01)

(56) References Cited

U.S. PATENT DOCUMENTS

| | | | |
|---|---|---|---|
| 4,061,042 A | | 12/1977 | Hetrich |
| 4,068,176 A | | 1/1978 | McTaggart |
| 4,528,501 A | | 7/1985 | Dorrough et al. |
| 4,548,082 A | | 10/1985 | Engebretson et al. |
| 5,528,255 A | * | 6/1996 | Hagimori .................. 381/56 |
| 5,751,819 A | | 5/1998 | Dorrough |
| 5,926,334 A | | 7/1999 | Suzuki et al. |
| 6,098,463 A | * | 8/2000 | Goldberg .................. 324/438 |
| 2002/0015014 A1 | | 2/2002 | Sakashita et al. |
| 2005/0008164 A1 | * | 1/2005 | Kakishita .................. 381/58 |
| 2005/0123144 A1 | | 6/2005 | Wallace |

FOREIGN PATENT DOCUMENTS

| | | |
|---|---|---|
| EP | 0024140 | 2/1981 |
| EP | 128848 | 12/1984 |
| EP | 0241835 | 1/1987 |
| EP | 1133192 | 9/2001 |
| GB | 2017938 | 10/1979 |
| GB | 2039693 | 8/1980 |
| GB | 2054873 | 2/1981 |
| JP | 52118973 | 10/1977 |
| JP | 1185011 | 7/1989 |
| JP | 2027582 | 1/1990 |
| JP | 3095469 | 4/1991 |
| JP | 3217898 | 9/1991 |
| JP | 422999 | 1/1992 |
| JP | 8223698 | 8/1996 |
| JP | 09305908 | 11/1997 |
| JP | 11101654 | 4/1999 |
| JP | 11125052 | 5/1999 |
| JP | 2001060835 | 3/2001 |
| KR | 9503630 | 4/1995 |
| SU | 1402809 | 6/1988 |

OTHER PUBLICATIONS

Ankermann et al., "Level meter with display of the transient sample value distribution", ITG Fachberichte, Mannheim, Germany, Feb. 18, 1992, vol. 118, pp. 163-169. English Abstract.

Keeley, J., "Simple audio oscillator", Practical Wireless, Mar. 1986, vol. 62, No. 3, pp. 28-30. English Abstract.

Del Campo, J. "Analogue frequency meter for audio frequencies", Revista Espanola Electronica, Feb. 1981, vol. 28, No. 315, pp. 38-40. English Abstract.

Anonymous, "Audio frequency meter", Elector, Aug. 1980, vol. 6, pp. 7-88. Eng Abstract.

* cited by examiner

AUDIO LEVEL METER

This application is a divisional of co-pending U.S. application Ser. No. 12/309,791, filed Jan. 30, 2009 now U.S. Pat. No. 8,295,958, herein incorporated by reference.

Fixed correction terms for detectors using input filters having fixed attack/release times or other detector types are commonly used in AC voltage measurement equipment like Multimeters or audio measurement systems like "Audio Precision".

Various types of audio level meters exist, like e.g., the VU (Volume Unit) Meter and the Peak Program Meter, whose readings differ for the same input signal and are not easy to compare with each other. This is due to the fact that an audio level meter shall serve two conflicting purposes. On the one hand, it shall indicate the perceived loudness of an audio signal, which is related to the signal power. On the other hand, it shall also indicate the headroom that is still left before the system goes into saturation as this would cause audible distortions. In this regard, further distinguishing is needed between an analog and a digital system. An analog system overloads relatively gradually whereas a digital one overloads abruptly. Therefore, an object of the invention is to correct the output level so that it displays the true signal power, whatever the internal settings of the audio level meter, for a sinusoidal signal being supplied to the input.

SUMMARY OF THE INVENTION

The invention is directed to an apparatus and a method for determining the difference between the true signal power and an audio level meter reading for various types of audio level meters, including audio level meters that, at their inputs, produce the square of the input signal or the absolute value of the input signal, as presented in claims 1 and 6. Further advantageous embodiments and developments of the invention are presented in the dependent claims.

BRIEF DESCRIPTION OF THE DRAWINGS

In the following the invention will be described with reference to the drawings, in which.

DETAILED DESCRIPTION OF THE INVENTION

The invention is based upon the finding that, for a sinusoidal input signal, the difference between the true signal power and the reading of an audio level meter substantially only depends from three variables: The treatment of the input signal, i.e. determining the absolute value or squaring the input signal, the attack time of a lowpass filter used in the audio level meter and the release time of that filter.

In a corresponding equation $phi\_0$ is the phase angle, for which the rising and decaying portions of a signal under test are equal.

In the case of a squared input signal, $phi\_0$ is determined according to the following equation:

$$(b-a)*\sin(2*phi\_0)-2*(b-a)*phi\_0*\cos(2*phi\_0)-a*pi*\cos(2*phi\_0)=0$$

In the case of the absolute value of the input signal being determined, $phi\_0$ is determined according to the following equation:

$$(a-b)*phi\_0*\sin(phi\_0)+(a-b)*\cos(phi\_0)+b-a*pi/2*\sin(phi\_0)=0$$

wherein $a=1-\exp(-1/(\tau_a \cdot f_s))$, $b=1-\exp(-1/(\tau_r \cdot f_s))$ and $f_s$ is the sampling frequency.

When dividing the equations by 'a' it will become obvious that $phi\_0$ depends merely on the ratio $b/a$. If $\tau_a \gg 1/fs$ and $\tau_r \gg 1/fs$ $b/a$ is substantially equal to $\tau_a/\tau_r$.

The output signal is then calculated as $$\text{output\_level}=A*\sin(phi\_0)$$

wherein A corresponds to the amplitude of the input signal. The desired reading should, however, correspond to $$\text{output\_level\_sin}=A*\sin(pi/4).$$

This results in a difference, expressed in dB, as follows:

$$\text{Delta\_dB}=20*\log 10(\text{output\_level}/\text{output\_level\_sin}),$$

or $$\text{Delta\_dB}=20*\log 10(\sin(phi\_0))+3. \quad \text{Note: } \sin(pi/4)^2=0.5)$$

Figure 1:
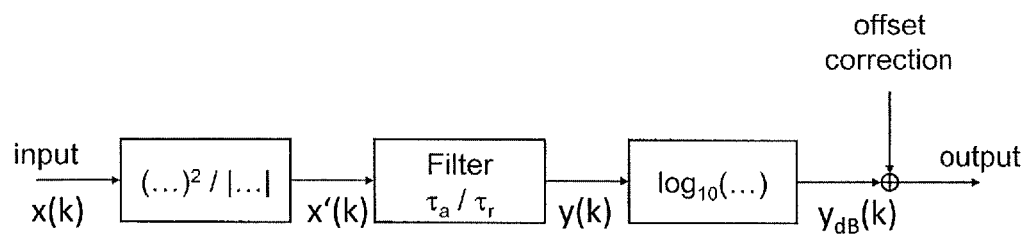
FIG. 1 shows a block diagram of an audio level meter in accordance with the invention.
Figure 3:
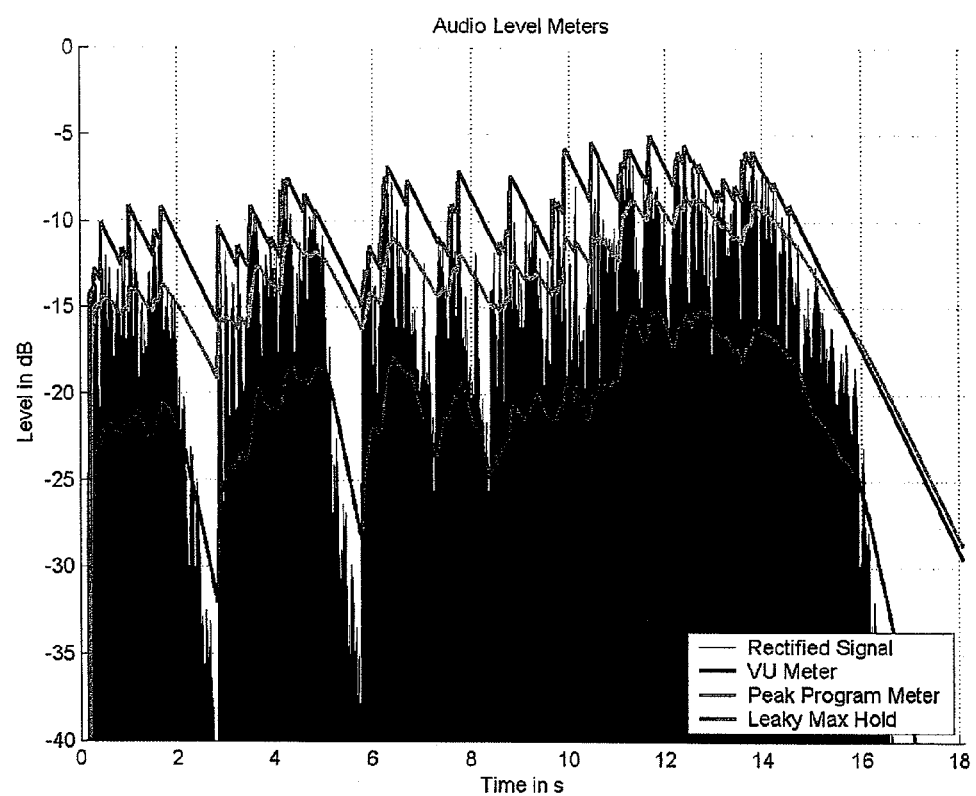
FIG. 3 shows exemplary output values of various types of audio level meters resulting from the same input signal.

As indicated in the block diagram in FIG. 1, an audio level meter according to the invention consists of three building blocks: First, the input signal $x(k)$ is either squared or rectified, which yields $x'(k)$. Second, a 1st order low-pass filter is applied. Its attack time $\tau_a$ and release time $\tau_r$ may differ so that, depending on the current input sample $x'(k)$ being greater or smaller than the last output signal $y(k-1)$, two different differential equations are used to calculate the new output $y(k)$, i.e., $$y(k) = \begin{cases} a \cdot x'(k) + (1-a) \cdot y(k-1) \\ b \cdot x'(k) + (1-b) \cdot y(k-1) \end{cases}, \text{ if } \begin{array}{l} x'(k) > y(k-1) \\ x'(k) \le y(k-1) \end{array}$$

where $a=1-\exp(-1/(\tau_a \cdot f_s))$, $b=1-\exp(-1/(\tau_r \cdot f_s))$ and $f_s$ is the sampling frequency. In other words, the two differential equations represent a rising or a falling input signal, respectively. Finally, the result is converted from linear scale to logarithmic scale in decibels by correspondingly applying a logarithm, i.e., $y_{dB}(k)=20 \log_{10} y(k)$ or $y_{dB}(k)=10 \log_{10} y(k)$ depending on whether the input signal was rectified or squared in the first step. Therefore, there are in total three internal parameters, which influence the output of an audio level meter: rectification/squaring, attack time $\tau_a$ and release time $\tau_r$. Note that an exception to this signal flow is represented by audio level meters that shall solely indicate the maximum of the signal to prevent any overload from occurring. They either hold a maximum for a preset time or they let it decrease exponentially. FIG. 3 shows exemplary output values of various types of audio level meters resulting from the same input signal.

Sinusoidal input signals are commonly used as test signals. Especially for non-professional users, it is likely to be rather distracting if the reading of the audio level meter does not match the applied signal power. As sinusoids are, however, completely defined by their amplitude and frequency (and, strictly speaking, also their phase), the output of an audio level meter can be calculated relatively easy for the steady state (at least approximately and as long as the attack and release times are sufficiently large compared with the input period). Thus, the output can be corrected to reflect the true signal power in this case. The analysis results in nonlinear equations, which need to be solved numerically. To avoid that such a complex task needs to be performed online, look-up tables with linear interpolation between the entries are used instead. Fortunately, the output level is independent of the frequency of the input sinusoid. Furthermore, it only depends on the ratio between the release and the attack time and not on their individual values. Finally, the level offset, or difference, in dB is also independent of the amplitude of the input signal. Therefore, two equations, one for a rectified and one for a squared signal, are sufficient to calculate the offset that needs to be applied. Using only the indicated sampling points with linear interpolation in between, the maximal error remains below approximately 0.1 dB for the complete range of time ratios. Note that an alternative implementation could consist in replacing the additive correction downstream of the logarithm stage by a corresponding multiplicative one upstream thereof.

Figure 2:
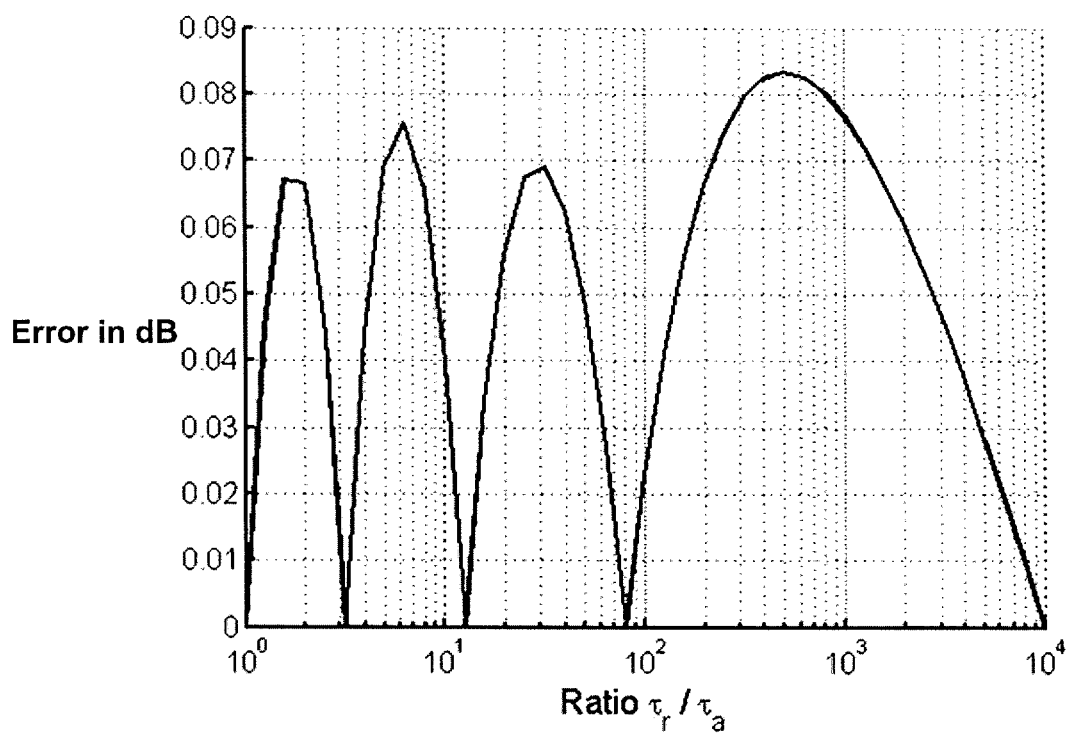
FIG. 2 exemplarily shows the error in dB between the calculated correction value and the correction value obtained from look-up-tables.
Figure 5:
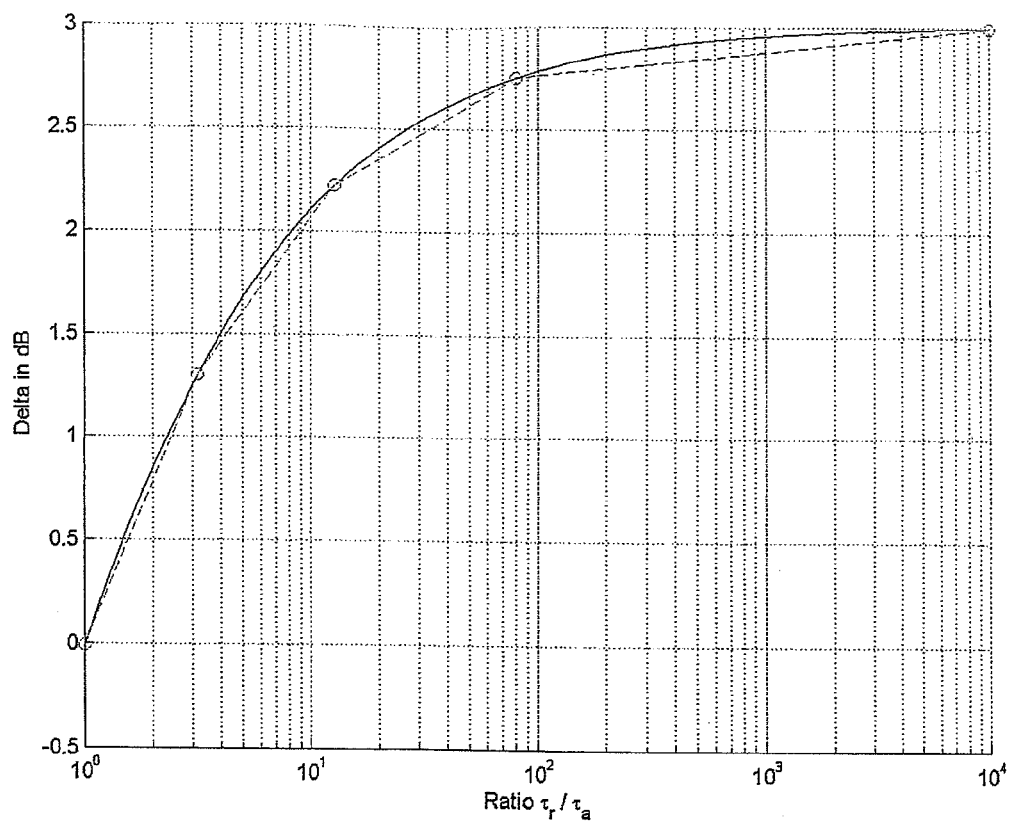
FIG. 5 shows the correction value for the error shown in FIG. 2 as a function of the ratio between the attack and release times.

FIG. 2 shows the error in dB between the correction value calculated according to the differential equations and the interpolated correction values determined from the look-up table for the correction of an audio level meter using a squared audio signal as an input signal. FIG. 5 accordingly shows the correction value as a function of the ratio between the attack and release times.

Figure 4:
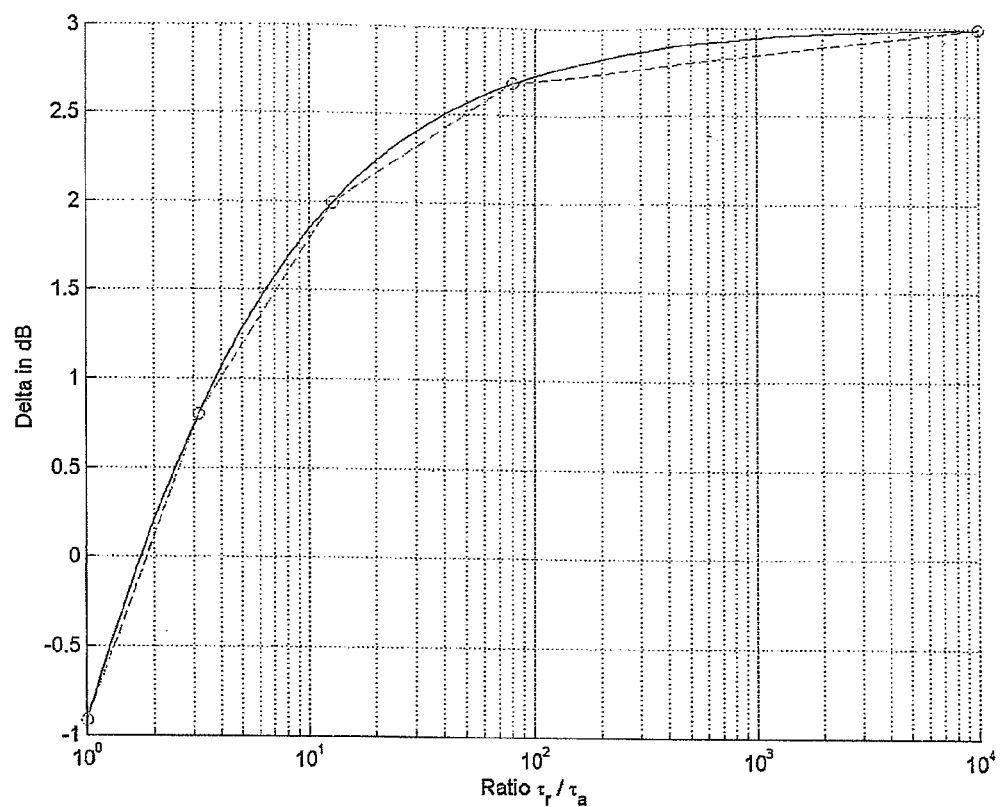
FIG. 4 shows the correction value for an audio level meter using an absolute peak value as an input signal as a function between the attack and release times.

FIG. 4 shows the correction value for an audio level meter using an absolute peak value of the input signal as an input as a function of the ratio between the attack and release times.

For testing, a waveform generator producing a sinusoidal test signal simply needs to be attached to the audio level meter, and the settings of the waveform generator and the output of the audio level meter compared with each other for $\tau_a \neq \tau_r$.

The invention claimed is:

1. A method of correcting the output of an audio level meter including:
   processing an input signal to generate one of a square or absolute value of the input signal;
   filtering the processed input signal in a low pass filter having an attack time and release time;
   converting the filtered signal from a linear scale to a logarithmic scale to generate the output of the audio level meter; and
   calculating a value representing a difference between the output of the audio level meter and a true signal power in accordance with whether the input signal was subject to squaring or converting into an absolute value, and in accordance with the attack and release time of the low pass filter.

2. The method of claim 1, further comprising adding the calculated value representing the difference between the output of the audio level meter and the true signal power to the output value of the audio level meter.

3. The method of claim 1, further comprising multiplying an output of the low pass filter with a correction value determined from the calculated value and a signal power of the input signal prior to converting into the logarithmic scale.

4. The method of claim 1, wherein calculating the value representing the difference between the output of the audio level meter and the true signal power is based upon a look-up table holding values representing the difference between the output of the audio level meter and a signal power of the input signal for a number of ratios of attack and release times of the low pass filter and for forming the one of the absolute value squaring the input signal.

5. The method of claim 4, further comprising interpolating values for ratios not included in the look-up table.

6. A non-transitory computer-readable medium having computer readable instructions stored thereon for execution by a processor in an apparatus having an audio level meter to perform correction of the output of the audio level meter by:
   processing an input signal to generate one of a square or absolute value of the input signal;
   filtering the processed input signal in a low pass filter having an attack time and release time;
   converting the filtered signal from a linear scale to a logarithmic scale; and
   calculating a value representing a difference between the output of the audio level meter and a true signal power in accordance with whether the input signal was subject to squaring or converting into an absolute value, and in accordance with the attack and release time of the low pass filter.

7. The non-transitory computer-readable medium of claim 6, wherein the audio level meter further adds the calculated value representing the difference between the output of the audio level meter and the true signal power to the output value of the audio level meter.

8. The non-transitory computer-readable medium of claim 6, wherein the audio level meter further for multiplying multiplies the filtered signal with a correction value determined from the calculated value representing the difference between the output of the audio level meter and a signal power of the input signal prior to converting into logarithmic scale.

9. The non-transitory computer-readable medium of claim 6, wherein the audio level meter calculates the value representing the difference between the output of the audio level meter and the true signal power based upon a look-up table holding values representing the difference between the output of the audio level meter and a signal power of the input signal for a number of ratios of attack and release times of the low pass filter and for forming the one of the absolute value squaring the input signal.

10. The non-transitory computer-readable medium of claim 9, wherein the audio level meter further interpolates values for ratios not included in the look-up table.

* * * * *